US012635480B2

(12) United States Patent
Fujibayashi et al.

(10) Patent No.: US 12,635,480 B2
(45) Date of Patent: May 19, 2026

(54) SEMICONDUCTOR WAFER MANUFACTURING APPARATUS

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Hiroaki Fujibayashi, Nisshin (JP); Hirotaka Mori, Nisshin (JP); Takayuki Satomura, Nisshin (JP); Shigeyuki Takagi, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 405 days.

(21) Appl. No.: 18/350,251

(22) Filed: Jul. 11, 2023

(65) Prior Publication Data

US 2024/0021464 A1      Jan. 18, 2024

(30) Foreign Application Priority Data

Jul. 13, 2022    (JP) ................................. 2022-112726

(51) Int. Cl.
  *H10P 72/76*      (2026.01)
  *C23C 16/44*      (2006.01)
        (Continued)

(52) U.S. Cl.
  CPC ...... *H10P 72/7624* (2026.01); *C23C 16/4412* (2013.01); *C23C 16/45557* (2013.01); *C23C 16/4584* (2013.01); *C23C 16/4586* (2013.01)

(58) Field of Classification Search
  CPC ........... C23C 16/4408; C23C 16/4412; C23C 16/45557; C23C 16/4584; C23C 16/4586;
        (Continued)

(56) References Cited

U.S. PATENT DOCUMENTS 5,711,815 A * 1/1998 Lee ................... C23C 16/45521
                                              118/728
6,403,479 B1 * 6/2002 Watanabe ......... C23C 16/45565
                                              438/758

(Continued)

FOREIGN PATENT DOCUMENTS

JP      2007-019350 A      1/2007

OTHER PUBLICATIONS

U.S. Appl. No. 18/350,307, filed Jul. 11, 2023, Fujibayashi et al.

*Primary Examiner* — Benjamin Kendall
(74) *Attorney, Agent, or Firm* — Posz Law Group, PLC

(57) ABSTRACT

A semiconductor wafer manufacturing apparatus includes a reaction chamber, a reactant gas supply pipe and a reactant gas discharge pipe communicated with the reaction chamber, a rotating device having a cylindrical member, a lid member disposed on one end portion of the cylindrical member, a heating device disposed in a hollow chamber that is a space surrounded by the cylindrical member and the lid member, an inert gas supply pipe and an inert gas discharge pipe communicated with the hollow chamber, and a controller. The controller is configured to adjust an amount of an inert gas discharged from the inert has discharge pipe such that a pressure in the hollow chamber is higher than a pressure in the reaction chamber and equal to or lower than a pressure of a minimum closing portion of the lid member.

16 Claims, 6 Drawing Sheets

(51) Int. Cl.
    *C23C 16/455*       (2006.01)
    *C23C 16/458*       (2006.01)

(58) Field of Classification Search
    CPC ........ C23C 16/46–466; H01J 37/32724; H01J
             37/32834; H01L 21/68785; H10P 72/7624
    See application file for complete search history.

(56)            References Cited

U.S. PATENT DOCUMENTS

| | | | |
|---|---|---|---|
| 2001/0052316 A1* | 12/2001 | Iwata | C23C 16/45521 |
| | | | 117/85 |
| 2009/0068851 A1* | 3/2009 | Hirata | H01L 21/68764 |
| | | | 257/E21.24 |
| 2009/0269490 A1 | 10/2009 | Moriyama et al. | |
| 2012/0048180 A1 | 3/2012 | Ito et al. | |
| 2014/0287539 A1* | 9/2014 | Ito | C30B 25/16 |
| | | | 118/712 |
| 2015/0329967 A1 | 11/2015 | Ito et al. | |

* cited by examiner

SEMICONDUCTOR WAFER MANUFACTURING APPARATUS

CROSS REFERENCE TO RELATED APPLICATION

The present application claims the benefit of priority from Japanese Patent Application No. 2022-112726 filed on Jul. 13, 2022. The entire disclosure of the above application is incorporated herein by reference.

TECHNICAL FIELD

The present disclosure relates to a semiconductor wafer manufacturing apparatus.

BACKGROUND

Conventionally, there has been proposed a semiconductor wafer manufacturing apparatus for growing an epitaxial layer, which is a semiconductor layer, on a surface of a base wafer by rotating and heating the base wafer in a state where the base wafer is placed on a susceptor in a reaction chamber into which a reactant gas containing a raw material gas is introduced.

SUMMARY

The present disclosure provides a semiconductor wafer manufacturing apparatus that includes a reaction chamber forming portion forming a reaction chamber, a reactant gas supply pipe and a reactant gas discharge pipe communicated with the reaction chamber, a rotating device having a cylindrical member, a lid member disposed on one end portion of the cylindrical member, a heating device disposed in a hollow chamber surrounded by the cylindrical member and the lid member, an inert gas supply pipe and an inert gas discharge pipe communicated with the hollow chamber, and a controller. The controller is configured to adjust an amount of an inert gas discharged from the inert gas discharge pipe such that a pressure in the hollow chamber is higher than a pressure in the reaction chamber and equal to or lower than a pressure of a minimum closing portion of the lid member.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
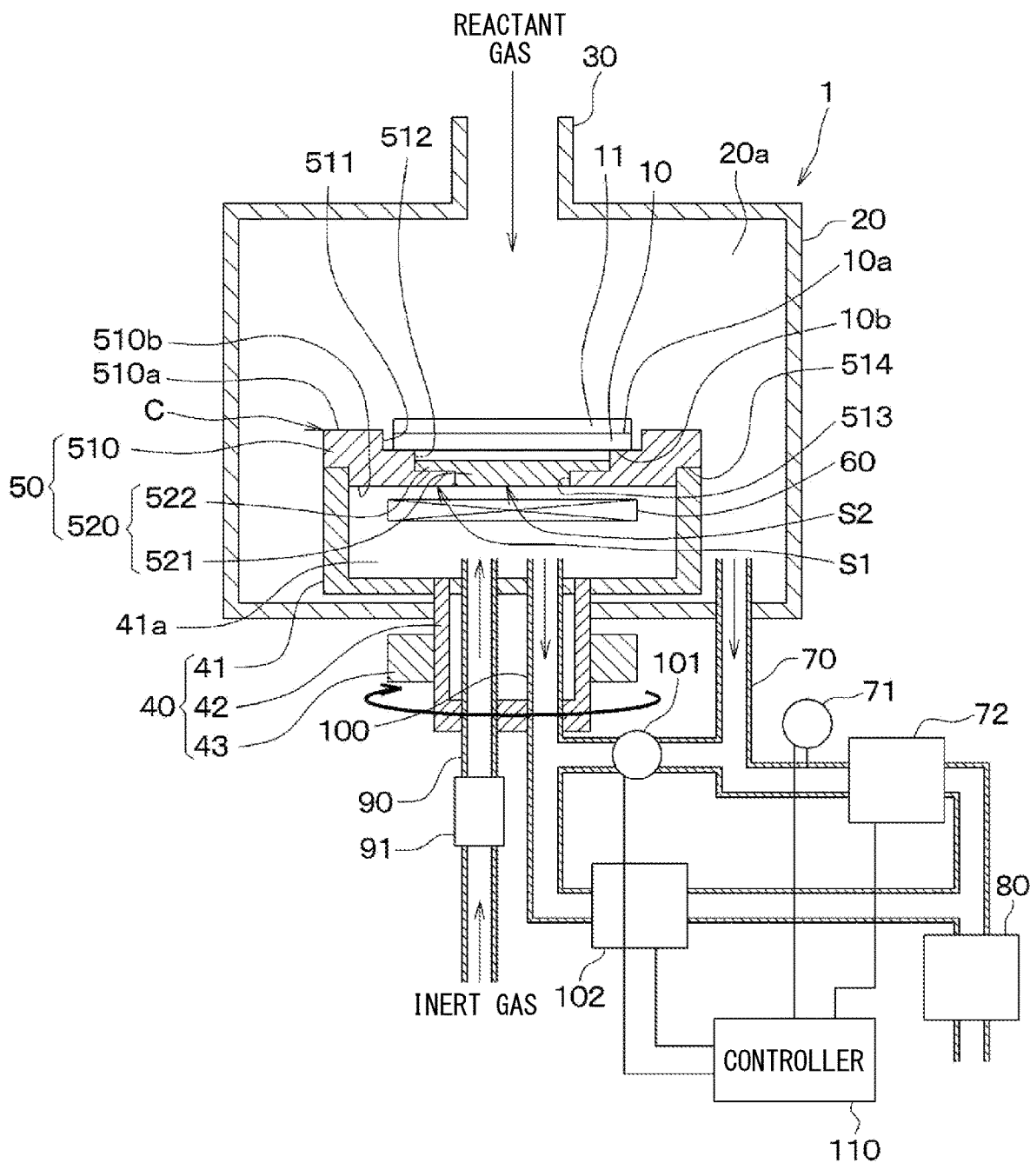
FIG. 1 is a schematic view illustrating a semiconductor wafer manufacturing apparatus according to a first embodiment.

In a semiconductor wafer manufacturing apparatus according to a related art, a rotating device on which a base wafer is placed is disposed in a reaction chamber. The rotating device is configured to have a cylindrical member having an opening end portion at one end, and an inside of the cylindrical member is substantially closed by disposing a lid member including a susceptor at the opening end portion. When a space surrounded by the cylindrical member and the lid member is referred to as a hollow chamber, a heating device for heating the base wafer from a direction close to a rear surface of the base wafer is disposed in the hollow chamber. As the heating device, for example, a resistance heating heater made of carbon is used.

In the semiconductor wafer manufacturing apparatus described above, an inert gas is introduced into the hollow chamber in order to restrict a reactant gas from flowing from the reaction chamber into the hollow chamber and reacting with the heating device. Specifically, in the semiconductor wafer manufacturing apparatus, the inert gas is introduced into the hollow chamber to make the pressure in the hollow chamber higher than the pressure in the reaction chamber, thereby making it difficult for the reactant gas to flow from the reaction chamber into the hollow chamber.

However, when the pressure in the hollow chamber is set to be excessively higher than the pressure in the reaction chamber, there is a possibility that the lid member for closing the cylindrical member floats and is separated from the cylindrical member, and the epitaxial layer cannot be grown appropriately.

A semiconductor wafer manufacturing apparatus according to an aspect of the present disclosure includes a reaction chamber forming member, a reactant gas supply pipe, a reactant gas discharge pipe, a susceptor, a rotating device, a lid member, a heating device, an inert gas supply pipe, an inert gas discharge pipe, and a controller. The reaction chamber forming member forms a reaction chamber into which a reactant gas is to be introduced and in which an epitaxial layer is to be grown on a front surface of a base wafer. The reactant gas supply pipe is communicated with the reaction chamber and is configured to supply the reactant gas for growing the epitaxial layer to the reaction chamber. The reactant gas discharge pipe is communicated with the reaction chamber and is configured to discharge an unreacted gas from the reaction chamber. The susceptor is disposed in the reaction chamber and the base wafer is to be placed on the susceptor. The rotating device has a cylindrical member with one end portion on which the susceptor is disposed and is configured to rotate the susceptor together with the base wafer. The lid member includes the susceptor and is disposed on the one end portion of the cylindrical member. The heating device is disposed in a hollow chamber that is a space surrounded by the cylindrical member and the lid member and is configured to heat the base wafer. The inert gas supply pipe is communicated with the hollow chamber and is configured to introduce an inert gas into the hollow chamber. The inert gas discharge pipe is communicated with the hollow chamber and is configured to discharge the inert gas. The controller is configured to adjust an amount of the inert gas discharged from the inert gas discharge pipe such that a pressure in the hollow chamber is higher than a pressure in the reaction chamber and equal to or lower than a pressure of a minimum closing portion. A value obtained by dividing a mass of the lid member by an area of a portion of the lid member exposed to the hollow chamber is defined as a pressure of the lid member, and the pressure of the minimum closing portion is a pressure of a portion of the lid member at which the pressure of the lid member is minimum.

In the above configuration, the pressure in the hollow chamber is made higher than the pressure in the reaction chamber. Therefore, it is possible to restrict the reactant gas from entering the hollow chamber from the reaction chamber, and it is possible to restrict the life of the heating device from being shortened. The pressure in the hollow chamber is set to be equal to or lower than the pressure of the minimum closing portion. Thus, it is possible to restrict the floating of the portion where the pressure of the lid member becomes the smallest by increasing the pressure in the hollow chamber, and it is possible to restrict the occurrence of an issue that the epitaxial layer cannot be grown appropriately.

The following describes embodiments of the present disclosure with reference to the drawings. In the following embodiments, the same or equivalent parts are denoted by the same reference numerals for description.

First Embodiment

A first embodiment will be described with reference to the drawings. A semiconductor wafer manufacturing apparatus according to the present embodiment is preferably applied to, for example, growing an epitaxial layer made of silicon carbide (SiC) on a surface of a base wafer to manufacture an SiC wafer. Hereinafter, a semiconductor wafer manufacturing apparatus (hereinafter, also simply referred to as a manufacturing apparatus) for manufacturing an SiC wafer will be described as an example of the semiconductor wafer manufacturing apparatus.

As shown in FIG. 1, a manufacturing apparatus 1 includes a chamber 20 that forms a reaction chamber 20a for growing an epitaxial layer 11 as a semiconductor layer on a front surface 10a of a base wafer 10. In the present embodiment, the chamber 20 corresponds to a reaction chamber forming member that forms the reaction chamber 20a.

A reactant gas supply pipe 30 configured to supply a reactant gas for growing a crystal thin film on the front surface 10a of the base wafer 10 is provided on an upper side of the chamber 20. In the present embodiment, in order to epitaxially grow SiC, the reactant gas includes, for example, a source gas including trichlorosilane (SiHCl$_3$) and propane (C$_3$H$_8$), a carrier gas including hydrogen and hydrogen chloride (HCl), and a dopant gas including nitrogen (N$_2$).

Specifically, the reactant gas supply pipe 30 is disposed on the upper side of the chamber 20 so that a position facing the front surface 10a of the base wafer 10 is opened. Accordingly, the reactant gas is supplied to the reaction chamber 20a from a direction intersecting the front surface 10a of the base wafer 10 (that is, a direction substantially perpendicular to the front surface 10a) toward the front surface 10a of the base wafer 10. Therefore, it can be said that the manufacturing apparatus 1 of the present embodiment has a downflow-type gas supply structure in which the reactant gas is blown down toward the front surface 10a of the base wafer 10.

Furthermore, a rotating device 40 to which the base wafer 10 is placed is disposed on a lower side of the reaction chamber 20a. In the present embodiment, the base wafer 10 is placed on a susceptor 50 disposed on the rotating device 40.

The rotating device 40 includes a cylindrical member 41, a rotating shaft 42, a driving unit 43, and the like. The cylindrical member 41 is a member having a bottomed cylindrical shape and forms a hollow chamber 41a, and the susceptor 50 is disposed at an opening end portion. The cylindrical member 41 is disposed such that the opening end portion faces the upper side of the chamber 20 (that is, the side of the reactant gas supply pipe 30). The cylindrical member 41 (that is, the hollow chamber 41a) is configured such that an inert gas, which will be described later, is introduced therein.

The rotating shaft 42 is a shaft that is rotated by an output of the driving unit 43, and is connected to the cylindrical member 41 so as to be rotatable integrally with the cylindrical member 41. The driving unit 43 includes a motor or the like that outputs a rotational force, and rotates the rotating shaft 42. In the rotating device 40 configured as described above, the rotating shaft 42 is rotated by the output of the driving unit 43, and the cylindrical member 41 and the susceptor 50 are integrally rotated.

The susceptor 50 has an outer shape matching the opening end portion of the cylindrical member 41. The susceptor 50 of the present embodiment substantially closes the cylindrical member 41 by being disposed at the opening end portion of the cylindrical member 41. As a result, the hollow chamber 41a of the cylindrical member 41 is substantially closed.

Hereinafter, the shape of the susceptor 50 of the present embodiment will be described. The susceptor 50 of the present embodiment has an outer peripheral susceptor portion 510 and an inner peripheral susceptor portion 520.

The outer peripheral susceptor portion 510 is formed in a plate shape having a first surface 510a and a second surface 510b, and the first surface 510a has a first recessed portion 511 for accommodating the base wafer 10. In addition, in the outer peripheral susceptor portion 510, a second recessed portion 512 at which the inner peripheral susceptor portion 520 is disposed is provided in a substantially central portion of a bottom surface of the first recessed portion 511. Furthermore, in the outer peripheral susceptor portion 510, a through hole 513 is provided in a substantially central portion of a bottom surface of the second recessed portion 512. The outer peripheral susceptor portion 510 further has a step portion 514 for fitting with the opening end portion of the cylindrical member 41 at an outer peripheral portion of the second surface 510b. The outer peripheral susceptor portion 510 is disposed on the cylindrical member 41 by fitting the step portion 514 into the opening end portion of the cylindrical member 41.

The inner peripheral susceptor portion 520 is configured to have a protruding portion 521 and a plate portion 522. The protruding portion 521 is disposed in a substantially central portion of the plate portion 522, and is fitted in the through hole 513. The plate portion 522 is disposed on the bottom surface of the second recessed portion 512. In other words, the inner peripheral susceptor portion 520 has a configuration in which a recessed portion is formed at an outer peripheral portion of the plate portion 522 so that the protruding portion 521 is formed at an inner peripheral portion of the plate portion 522. The protruding portion 521 has the same shape and the same size as the through hole 513, and is configured to close the through hole 513 by being disposed. However, the inner peripheral susceptor portion 520 of the present embodiment is disposed so as to be separable from the outer peripheral susceptor portion 510.

In the present embodiment, the hollow chamber 41a of the cylindrical member 41 is substantially closed by the susceptor 50. Therefore, in the present embodiment, the lid member C that closes the cylindrical member 41 is comprised of the susceptor 50. The susceptor 50 disposed so as to close the cylindrical member 41 is disposed in a state of being exposed to the hollow chamber 41*a*. Specifically, a portion of the second surface 510*b* of the outer peripheral susceptor portion 510 that is different from the portion where the step portion 514 is formed and the portion where the through hole 513 is formed serves as an exposed surface S1 that is exposed to the hollow chamber 41*a*. The inner peripheral susceptor portion 520 has a tip surface in a protruding direction of the protruding portion 521, and the tip surface serves an exposed surface S2 that is exposed to the hollow chamber 41*a*.

A pressure caused by the outer peripheral susceptor portion 510 on the exposed surface S1 of the outer peripheral susceptor portion 510 (hereinafter, also simply referred to as a pressure of the outer peripheral susceptor portion 510) is represented by (the mass of the outer peripheral susceptor portion 510)/(the area of the exposed surface S1). Similarly, the pressure caused by the inner peripheral susceptor portion 520 on the exposed surface S2 of the inner peripheral susceptor portion 520 (hereinafter, also simply referred to as a pressure of the inner peripheral susceptor portion 520) is expressed by (the mass of the inner peripheral susceptor portion 520)/(the area of the exposed surface S2). The susceptor 50 of the present embodiment is configured such that the pressure of the inner peripheral susceptor portion 520 is lower than the pressure of the outer peripheral susceptor portion 510. Therefore, in the present embodiment, the pressure of the inner peripheral susceptor portion 520 corresponds to a pressure of a minimum closing portion.

A heater 60 as a heating device for heating the base wafer 10 from a direction close to a rear surface 10*b* of the base wafer 10 is disposed in the hollow chamber 41*a*. As the heater 60, for example, a resistance heating heater made of carbon is used. Although not illustrated, the heater 60 is connected to a controller 110 and is heated to a predetermined temperature.

On the lower side of the chamber 20, a reactant gas discharge pipe 70 for discharging a gas after reaction or an unreacted gas is provided. A portion of the reactant gas discharge pipe 70 located opposite to the chamber 20 is connected to a vacuum pump 80. The reactant gas discharge pipe 70 is provided with a pressure detection unit 71 and a pressure adjustment valve 72 between the chamber 20 and the vacuum pump 80. The pressure in the reaction chamber 20*a* is adjusted to a specified pressure by adjusting an opening and closing degree of the pressure adjustment valve 72 based on a pressure detected by the pressure detection unit 71.

In the hollow chamber 41*a*, an inert gas supply pipe 90 for supplying the inert gas and an inert gas discharge pipe 100 for discharging the inert gas are disposed. The inert gas supply pipe 90 is provided with a mass flow controller 91 and supplies the inert gas into the hollow chamber 41*a* at a constant flow rate. At this time, in the present embodiment, as will be described later, the pressure in the hollow chamber 41*a* is adjusted to be higher than the pressure in the reaction chamber 20*a*. Therefore, the reactant gas is restricted from entering the hollow chamber 41*a* through a gap between the lid member C (that is, the susceptor 50) and the cylindrical member 41.

A portion of the inert gas discharge pipe 100 located opposite to the hollow chamber 41*a* is connected to the vacuum pump 80. The inert gas discharge pipe 100 is provided with a pressure detection unit 101 and a pressure adjustment valve 102 between the hollow chamber 41*a* and the vacuum pump 80. The pressure in the hollow chamber 41*a* is adjusted to a predetermined pressure by adjusting an opening and closing degree of the pressure adjustment valve 102 based on a pressure detected by the pressure detection unit 101. In the present embodiment, the inert gas supply pipe 90 and the inert gas discharge pipe 100 are disposed in the cylindrical member 41 and communicate with the hollow chamber 41*a*.

The reactant gas discharge pipe 70 and the inert gas discharge pipe 100 of the present embodiment are partially connected to each other at a position opposite to the vacuum pump 80 across the respective pressure adjustment valves 72 and 102. The pressure detection unit 101 is disposed so as to detect a pressure difference at a connection portion between the reactant gas discharge pipe 70 and the inert gas discharge pipe 100. That is, the pressure detection unit 101 of the present embodiment detects the pressure difference between the pressure in the reaction chamber 20*a* and the pressure in the hollow chamber 41*a*.

Although not particularly illustrated, a susceptor lifting device is disposed in the hollow chamber 41*a*. The susceptor lifting device is configured to assist a transfer robot to load the susceptor 50 on which the base wafer 10 is placed into the reaction chamber 20*a* and to unload the susceptor 50 from the reaction chamber 20*a*. As the susceptor lifting and lowering device, for example, a device having a function of transferring the susceptor 50 to the transfer robot by raising the susceptor 50 and separating the susceptor 50 from the cylindrical member 41 when the susceptor 50 is transferred. In the present embodiment, the susceptor 50 is configured to have the outer peripheral susceptor portion 510 and the inner peripheral susceptor portion 520, and the inner peripheral susceptor portion 520 can be separated from the outer peripheral susceptor portion 510. Therefore, the transfer of the base wafer 10 can be facilitated. However, the manufacturing apparatus 1 does not have to perform loading and unloading of the susceptor 50 on which the base wafer 10 is placed, and may perform loading and unloading of only the base wafer 10 without moving the susceptor 50.

The manufacturing apparatus 1 further includes the controller 110. The controller 110 is configured by a microcomputer or the like including a central processing unit (CPU), a storage unit configured by a non-transitory tangible storage medium such as a read-only memory (ROM), a random access memory (RAM), a flash memory, or a hard disk drive (HDD), and the like.

The controller 110 realizes various control operations by the CPU reading and executing various data from the storage unit. Specifically, the controller 110 adjusts the opening and closing degree of the pressure adjustment valve 72 based on the pressure of the pressure detection unit 71 so that the pressure in the reaction chamber 20*a* becomes a specified pressure. In addition, the controller 110 adjusts the opening and closing degree of the pressure regulating valve 102 so that the pressure in the hollow chamber 41*a* becomes higher than the pressure in the reaction chamber 20*a* and equal to or lower than a predetermined pressure. In the present embodiment, since the pressure detection unit 101 is a differential pressure gauge, the controller 110 adjusts the opening and closing degree of the pressure adjustment valve 102 based on the result of the pressure detection unit 101.

Here, the predetermined pressure is a pressure at which the lid member C does not float (that is, the lid member C is not separated) due to the pressure in the hollow chamber 41*a*. In the manufacturing apparatus 1 of the present embodiment, the susceptor 50 includes the outer peripheral susceptor portion 510 and the inner peripheral susceptor portion 520. The pressure of the inner peripheral susceptor portion 520 is made smaller than the pressure of the outer peripheral susceptor portion 510. Therefore, the predetermined pressure is set to a pressure at which the inner peripheral susceptor portion 520 does not float, and is set to be equal to or lower than the pressure of the inner peripheral susceptor portion 520.

The above is the configuration of the manufacturing apparatus 1 according to the present embodiment. Next, a method of growing the epitaxial layer 11 on the front surface 10*a* of the base wafer 10 using the manufacturing apparatus 1 will be described.

First, in the manufacturing apparatus 1, the reaction chamber 20*a* is heated to about 1600 to 1750° C. by the heater 60 while the susceptor 50 on which the base wafer 10 is placed is rotated at, for example, 200 rpm by the rotating device 40. In the manufacturing apparatus 1, the reactant gas is supplied from the reactant gas supply pipe 30 toward the reaction chamber 20*a*, and the inert gas is supplied from the inert gas supply pipe 90.

Figure 2:
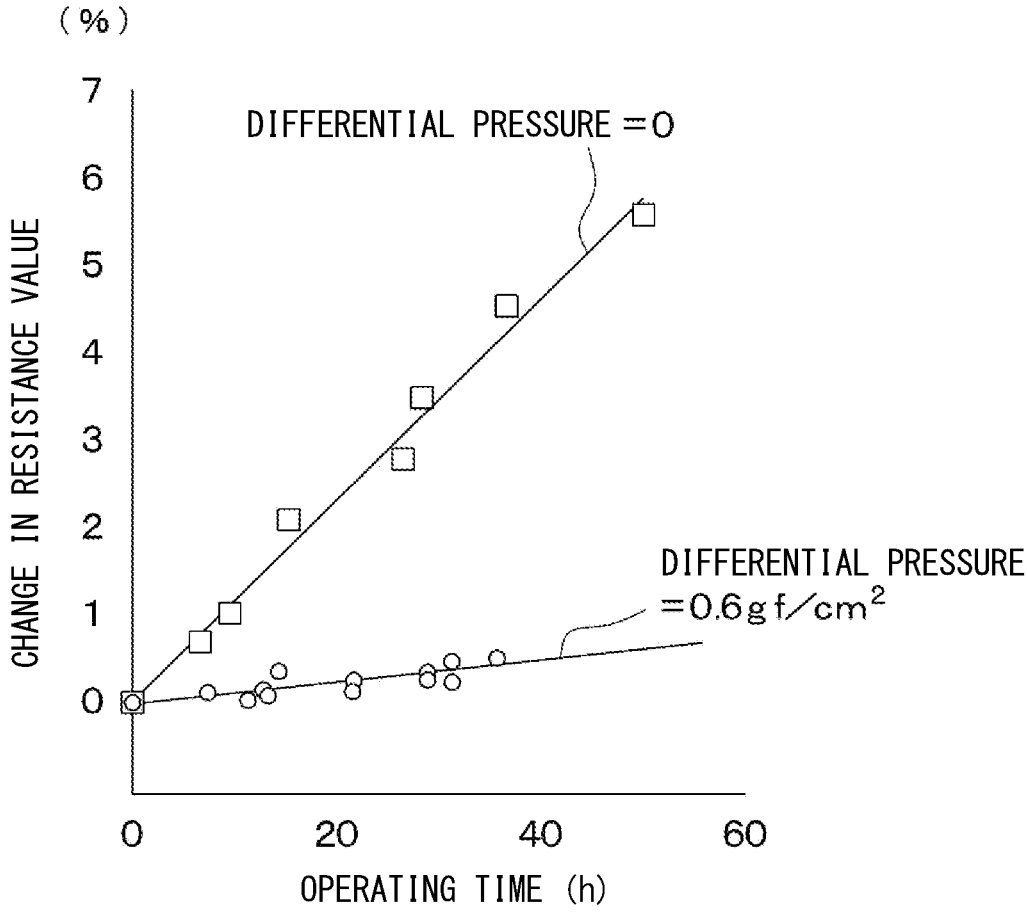
FIG. 2 is a diagram illustrating a relationship between an operating time and a change in resistance value.

In the present embodiment, the pressure in the hollow chamber 41*a* is adjusted to be higher than the pressure in the reaction chamber 20*a*. Accordingly, it is possible to restrict the reactant gas from entering the hollow chamber 41*a*. For example, as shown in FIG. 2, when the pressure in the hollow chamber 41*a* is equal to the pressure in the reaction chamber 20*a* (that is, the differential pressure is 0), it is confirmed that a resistance value of the heater 60 steeply increases with increase in operating time. On the other hand, in the present embodiment, the pressure in the hollow chamber 41*a* is set to be higher than the pressure in the reaction chamber 20*a*. For example, FIG. 2 shows the result of setting the pressure in the hollow chamber 41*a* to be higher than the pressure in the reaction chamber 20*a* by 0.6 gf/cm². Accordingly, it is possible to effectively restrict the reactant gas from entering the hollow chamber 41*a*, and it is possible to restrict the life of the heater 60 from being shortened.

In the present embodiment, the pressure in the hollow chamber 41*a* is adjusted so as to be higher than the pressure in the reaction chamber 20*a* and equal to or lower than the pressure of the inner peripheral susceptor portion 520. For example, when the mass of the inner peripheral susceptor portion 520 is 40 g and the area of the exposed surface S2 is 50 cm², the pressure of the inner peripheral susceptor portion 520 is 0.8 gf/cm² (that is, 78.4 Pa). Therefore, the pressure in the hollow chamber 41*a* is controlled to be 0.8 gf/cm² or less. Therefore, even when the pressure in the hollow chamber 41*a* is increased, it is possible to restrict the occurrence of issues that the inner peripheral susceptor portion 520 (that is, the susceptor 50) floats from the cylindrical member 41, the inner peripheral susceptor portion 520 collides with the base wafer 10 or the like, and the epitaxial layer 11 cannot be appropriately grown.

The inert gas is, for example, argon, but may be helium or the like. The flow rate of the inert gas is, for example, 6 slm, but can be changed as appropriate. However, in a case where the flow rate of the inert gas is too small, there is a possibility that the change in the discharge amount becomes small even if the opening and closing degree of the pressure adjustment valve 102 is changed, and there is a possibility that it becomes difficult to adjust the pressure in the hollow chamber 41*a* by the pressure adjustment valve 102. Therefore, the flow rate of the inert gas is preferably at least 1 slm.

In addition, by changing the thickness or the material of the susceptor 50 to increase the mass, the pressure of the susceptor 50 can be increased, and the pressure in the hollow chamber 41*a* can be further increased. However, when the thickness of the susceptor 50 is increased, the heat capacity increases, and the time until the base wafer 10 is heated to the predetermined temperature increases. Therefore, the thickness of the susceptor 50 (for example, the inner peripheral susceptor portion 520) is, for example, preferably 10 mm or less, and more preferably 5 mm or less.

In addition, when the mass of the susceptor 50 is increased, the pressure in the hollow chamber 41*a* can be easily increased, but a vibration when the susceptor 50 is rotated by the rotating device 40 is easily increased, and there is a possibility that the susceptor 50 is easily floated by the rotation. Therefore, the susceptor 50 is not preferably made of a material having an excessively large mass, and is preferably made of a material containing carbon, for example, from the viewpoint of mass, processing accuracy, and heat resistance. Therefore, in the present embodiment, the susceptor 50 is made of, for example, SiC or a material in which a surface of isotropic graphite is coated with SiC, tantalum carbide (TaC), niobium carbide (NbC), or the like. In this case, for example, a pressure converted from a density of C having a thickness of 10 mm is preferably set to 1.8 gf/cm² (176.4 Pa) or less, and for a thickness of 5 mm, the pressure is preferably set to 0.9 gf/cm² (88.2 Pa) or less.

According to the present embodiment described above, the pressure in the hollow chamber 41*a* is higher than the pressure in the reaction chamber 20*a*. Therefore, it is possible to restrict the reactant gas from entering the hollow chamber 41*a* from the reaction chamber 20*a*, and it is possible to restrict the life of the heater 60 from being shortened due to the reaction between the reactant gas and the heater 60.

The pressure in the hollow chamber 41*a* is equal to or lower than the pressure of the inner peripheral susceptor portion 520 (that is, the pressure of the minimum closing portion). Therefore, it is possible to restrict the occurrence of the issues that the inner peripheral susceptor portion 520 floats from the cylindrical member 41 by increasing the pressure in the hollow chamber 41*a*, the inner peripheral susceptor portion 520 collides with the base wafer 10 or the like, and the epitaxial layer 11 cannot be appropriately grown. That is, in the manufacturing apparatus 1 of the present embodiment, the epitaxial layer 11 can be suitably easily grown.

In the present embodiment, the susceptor 50 includes the outer peripheral susceptor portion 510 and the inner peripheral susceptor portion 520 which are separable. Therefore, at the time of disposing the base wafer 10 or the like, only the inner peripheral susceptor portion 520 can be transported, and the degree of freedom of installation of the base wafer 10 can be improved.

Second Embodiment

The following describes a second embodiment. The present embodiment is different from the first embodiment in the shape of the susceptor 50. The other configurations of the present embodiment are similar to those of the first embodiment, and therefore a description of the similar configurations will not be repeated.

Figure 3:
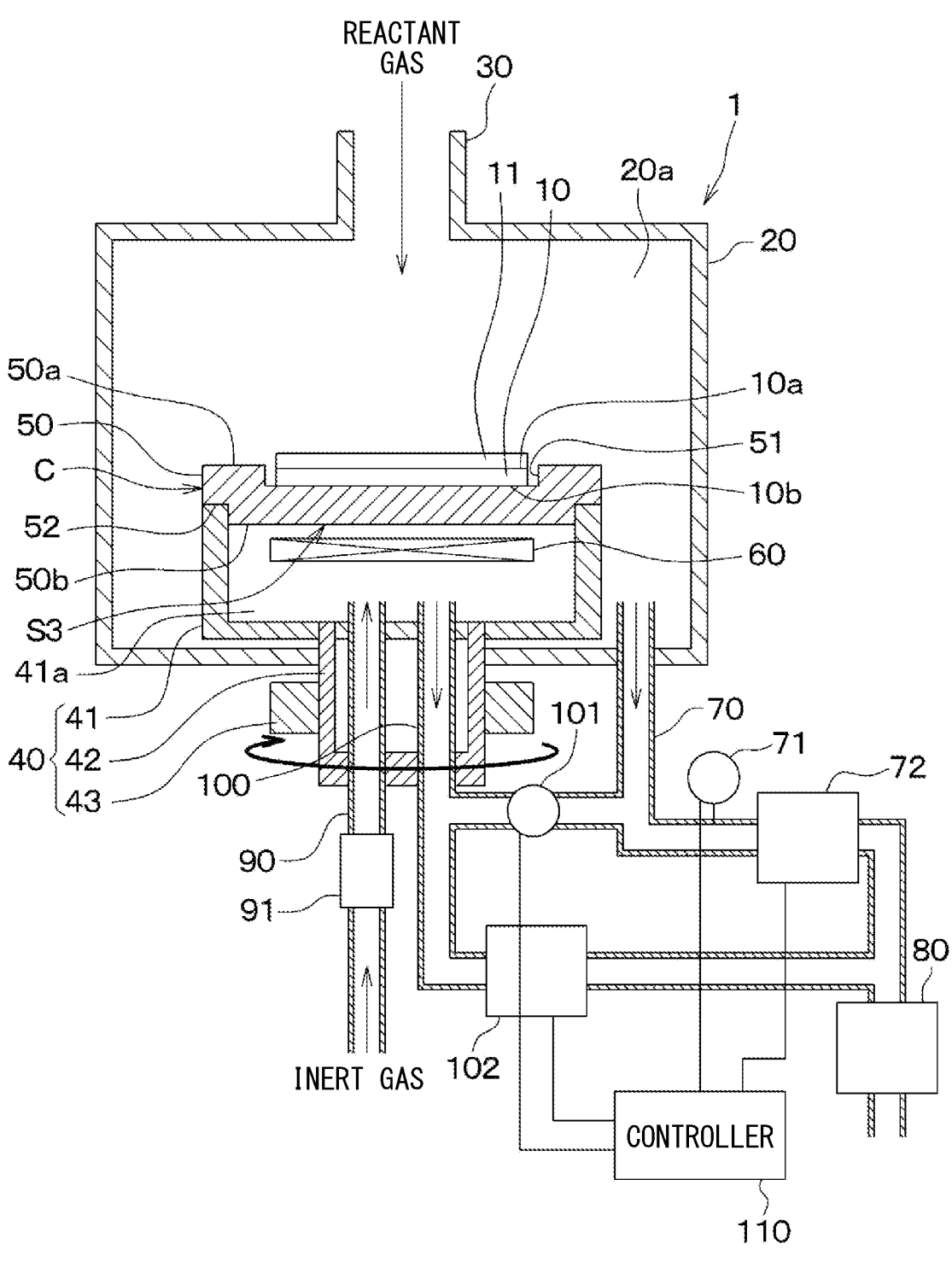
FIG. 3 is a schematic view illustrating a semiconductor wafer manufacturing apparatus according to a second embodiment.

In the present embodiment, as shown in FIG. 3, the susceptor 50 is formed of a single member. The susceptor 50 has a recessed portion 51 for accommodating the base wafer 10 on a first surface 50*a*. The susceptor 50 also has a step portion 52 formed on a second surface 50*b* so as to be fitted to the opening end portion of the cylindrical member 41. The susceptor 50 is disposed so as to close the cylindrical member 41 by fitting the stepped portion 52 into the opening end portion of the cylindrical member 41. In the present embodiment, the susceptor 50 is formed of the single member. Therefore, the lid member C is comprised of the susceptor 50.

The susceptor 50 is formed of the single member, and a portion of the second surface 50b that is different from the portion where the step portion 52 is formed serves as an exposed surface S3 that is exposed to the hollow chamber 41a. Therefore, in the susceptor 50, the pressure caused by the susceptor 50 on the exposed surface S3 (hereinafter, also simply referred to as a pressure of the susceptor 50) is (the mass of the susceptor 50)/(the area of the exposed surface S3). In the present embodiment, the pressure of the susceptor 50 corresponds to the pressure of the minimum closing portion.

When growing the epitaxial layer 11 on the front surface 10a of the base wafer 10, the controller 110 adjusts the pressure in the hollow chamber 41a to be higher than the pressure in the reaction chamber 20a and equal to or lower than the pressure of the susceptor 50.

According to the present embodiment described above, since the pressure in the hollow chamber 41a is adjusted to be higher than the pressure in the reaction chamber 20a and equal to or lower than the pressure of the minimum closing portion, effects similar to those of the first embodiment can be obtained.

In the present embodiment, the lid member C is comprised of the susceptor 50 which is the single member. Therefore, as compared with the case where the susceptor 50 has the outer peripheral susceptor portion 510 and the inner peripheral susceptor portion 520 as in the first embodiment, the pressure of the minimum closing portion can be increased, and the pressure in the hollow chamber 41a can be easily increased. Therefore, it is easier to restrict the reactant gas from entering the hollow chamber 41a from the reaction chamber 20a, and it is possible to restrict the life of the heater 60 from being shortened.

Third Embodiment

The following describes a third embodiment. The present embodiment is different from the second embodiment in the shape of the susceptor 50. The other configurations of the present embodiment are similar to those of the second embodiment, and therefore a description of the similar configurations will not be repeated.

Figure 4:
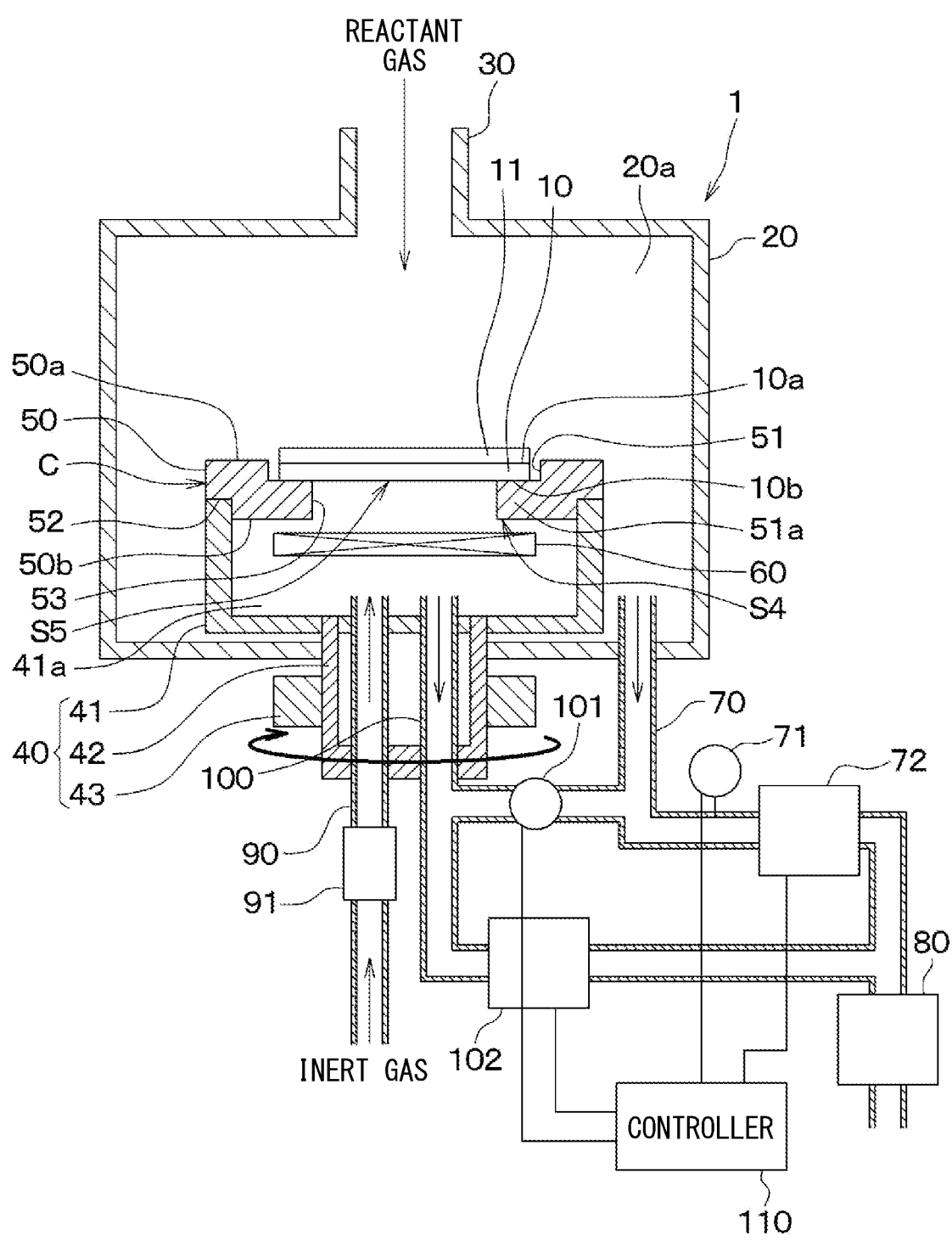
FIG. 4 is a schematic view illustrating a semiconductor wafer manufacturing apparatus according to a third embodiment.

In the present embodiment, as shown in FIG. 4, a through hole 53 is formed in a bottom 51a of the recessed portion 51 of the susceptor 50. Therefore, the hollow chamber 41a is closed by the susceptor 50 and the base wafer 10. That is, in the present embodiment, the lid member C is comprised of the susceptor 50 and the base wafer 10.

A portion of the second surface 50b of the susceptor 50 that is different from the portion where the through hole 53 serves as an exposed surface S4. A portion of the rear surface 10b of the base wafer 10 that closes the through hole 53 serves as an exposed surface S5.

The pressure caused by the susceptor 50 on the exposed surface S4 of the susceptor 50 (hereinafter, also simply referred to as a pressure of the susceptor 50) is expressed by (the mass of the susceptor 50)/(the area of the exposed surface S4). Similarly, the pressure caused by the base wafer 10 on the exposed surface S5 of the base wafer 10 (hereinafter, also simply referred to as a pressure of the base wafer 10) is expressed by (the mass of the base wafer 10)/(the area of the exposed surface S5). In the present embodiment, the pressure of the susceptor 50 is higher than the pressure of the base wafer 10. Therefore, in the present embodiment, the pressure of the base wafer 10 corresponds to the pressure of the minimum closing portion.

Then, when growing the epitaxial layer 11 on the front surface 10a of the base wafer 10, the controller 110 adjusts the pressure in the hollow chamber 41a to be higher than the pressure in the reaction chamber 20a and equal to or lower than the pressure of the base wafer 10.

According to the present embodiment described above, since the pressure in the hollow chamber 41a is adjusted to be higher than the pressure in the reaction chamber 20a and equal to or lower than the pressure of the minimum closing portion, effects similar to those of the first embodiment can be obtained.

Fourth Embodiment

The following describes a fourth embodiment. In the present embodiment, the arrangement position of the inert gas supply pipe 90 is adjusted as compared with the first embodiment. The other configurations of the present embodiment are similar to those of the first embodiment, and therefore a description of the similar configurations will not be repeated.

Figure 5:
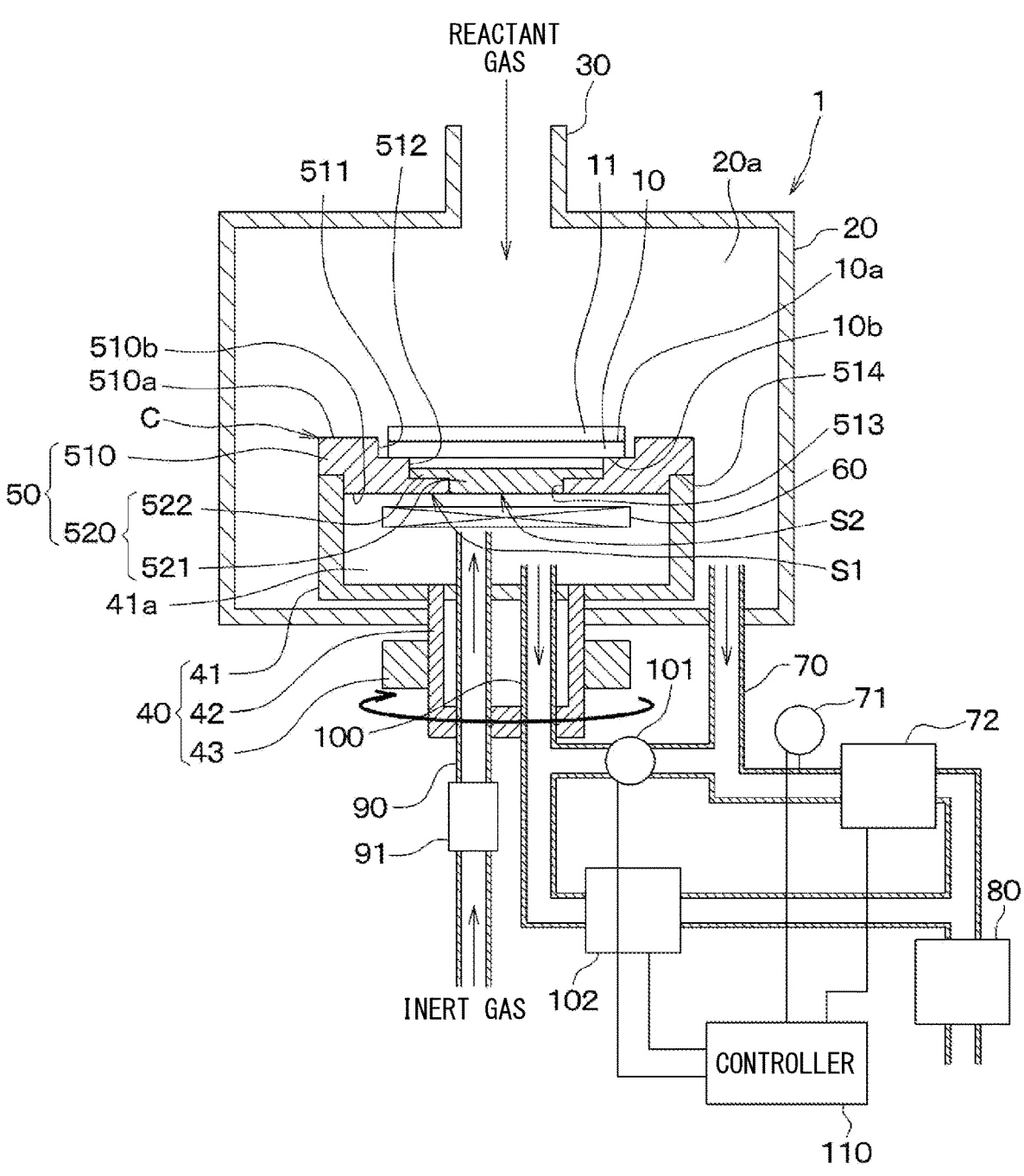
FIG. 5 is a schematic view illustrating a semiconductor wafer manufacturing apparatus according to a fourth embodiment.

In the present embodiment, as shown in FIG. 5, an opening end portion of the inert gas supply pipe 90 through which the inert gas is introduced is disposed closer to the center of the hollow chamber 41a than an opening end portion of the inert gas discharge pipe 100 through which the inert gas is suctioned.

According to the present embodiment described above, since the pressure in the hollow chamber 41a is adjusted to be higher than the pressure in the reaction chamber 20a and equal to or lower than the pressure of the minimum closing portion, effects similar to those of the first embodiment can be obtained.

In the present embodiment, the opening end portion of the inert gas supply pipe 90 through which the inert gas is introduced is disposed closer to the center of the hollow chamber 41a than the opening end portion of the inert gas discharge pipe 100 through which the inert gas is suctioned. Therefore, the hollow chamber 41a can be easily filled with the inert gas.

Fifth Embodiment

The following describes a fifth embodiment. The present embodiment is different from the first embodiment in the shape of the inert gas supply pipe 90. The other configurations of the present embodiment are similar to those of the first embodiment, and therefore a description of the similar configurations will not be repeated.

Figure 6:
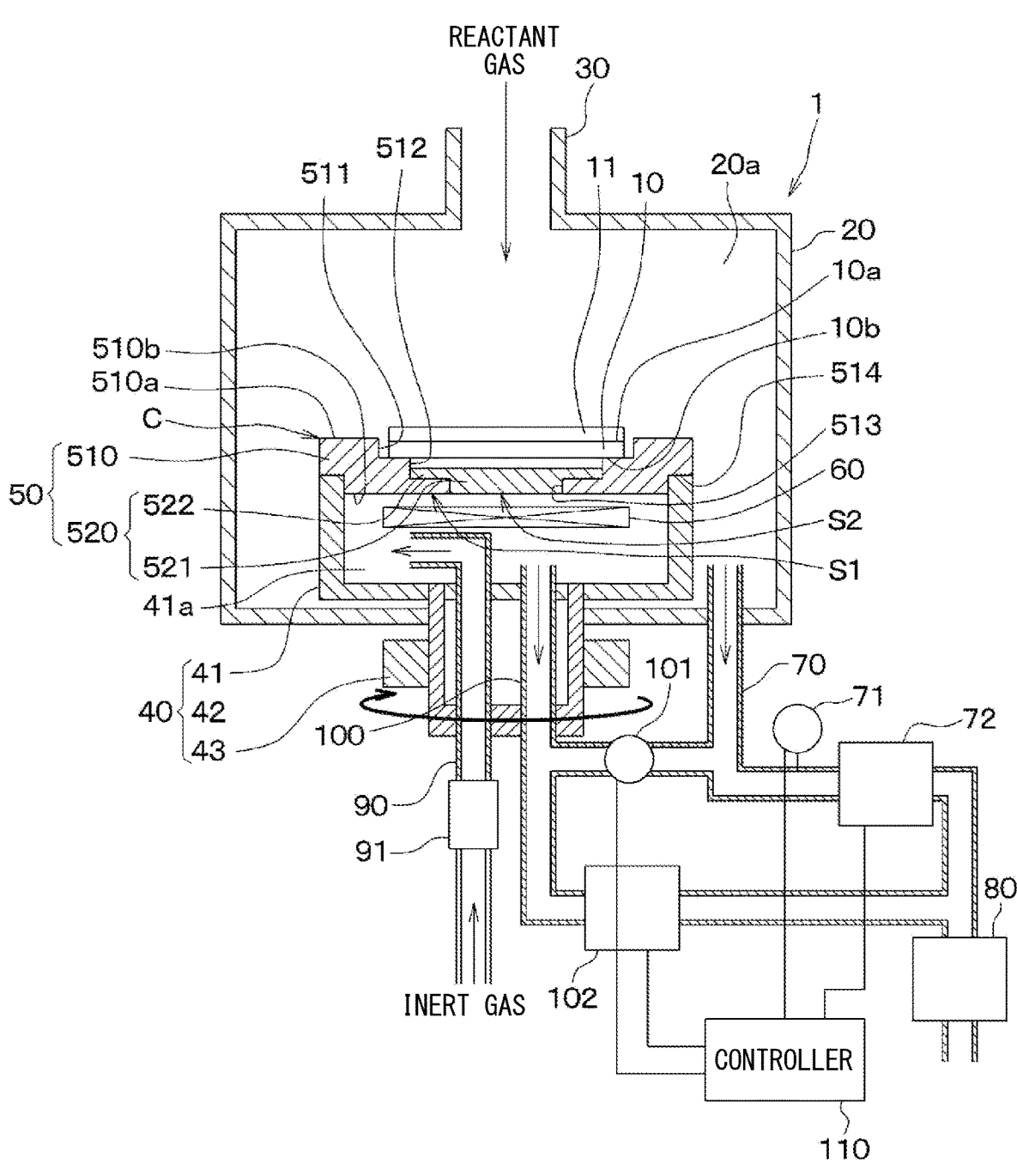
FIG. 6 is a schematic view illustrating a semiconductor wafer manufacturing apparatus according to a fifth embodiment.

In the present embodiment, as shown in FIG. 6, an opening end portion of the inert gas supply pipe 90 is bent in a direction opposite to the inert gas discharge pipe 100.

According to the present embodiment described above, since the pressure in the hollow chamber 41a is adjusted to be higher than the pressure in the reaction chamber 20a and equal to or lower than the pressure of the minimum closing portion, effects similar to those of the first embodiment can be obtained.

Furthermore, in the present embodiment, the opening end portion of the inert gas supply pipe 90 is bent in the direction opposite to the inert gas discharge pipe 100. Therefore, the hollow chamber 41a can be easily filled with the inert gas.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

For example, in each of the above embodiments, the manufacturing apparatus 1 for growing the SiC epitaxial layer 11 has been described as an example. However, the configuration of the epitaxial layer 11 to be grown can be appropriately changed, and for example, the manufacturing apparatus 1 may grow the epitaxial layer 11 of gallium nitride.

In each of the above embodiments, an example has been described in which the pressure detection unit 101 that detects the pressure in the hollow chamber 41a detects the differential pressure between the hollow chamber 41a and the reaction chamber 20a. However, the pressure of the hollow chamber 41a may be detected by the pressure detection unit 101, and the differential pressure between the reaction chamber 20a and the hollow chamber 41a may be derived by the controller 110. However, in order to restrict the lid member C from floating or the like while restricting the reactant gas from entering behind the rear surface 10b of the base wafer 10, detailed pressure management is required. Therefore, it is preferable that the pressure detection unit 101 directly detects the differential pressure between the reaction chamber 20a and the hollow chamber 41a.

The embodiments described above can also be combined with each other. For example, the fourth and fifth embodiments may be appropriately combined with the first to third embodiments, and the shape of the inert gas supply pipe 90 may be appropriately changed.

The controller and the method thereof described in the present disclosure are implemented by a dedicated computer provided by configuring a processor and a memory programmed to execute one or more functions embodied by a computer program. Alternatively, the controller and the method described in the present disclosure may be implemented by a special purpose computer configured as a processor with one or more special purpose hardware logic circuits. Alternatively, the controller and the method described in the present disclosure may be implemented by one or more special purpose computer, which is configured as a combination of a processor and a memory, which are programmed to perform one or more functions, and a processor which is configured with one or more hardware logic circuits. The computer program may be stored, as instructions to be executed by a computer, in a tangible non-transitory computer-readable medium.

What is claimed is:

1. A semiconductor wafer manufacturing apparatus comprising:

a reaction chamber forming member that forms a reaction chamber into which a reactant gas is to be introduced and in which an epitaxial layer is to be grown on a front surface of a base wafer;

a reactant gas supply pipe communicated with the reaction chamber and configured to supply the reactant gas for growing the epitaxial layer to the reaction chamber;

a reactant gas discharge pipe communicated with the reaction chamber and configured to discharge an unreacted gas from the reaction chamber;

a susceptor disposed in the reaction chamber and on which the base wafer is to be placed;

a rotating device having a cylindrical member with one end portion on which the susceptor is disposed and configured to rotate the susceptor together with the base wafer;

a lid member including the susceptor and disposed on the one end portion of the cylindrical member;

a heating device disposed in a hollow chamber that is a space surrounded by the cylindrical member and the lid member and configured to heat the base wafer;

an inert gas supply pipe communicated with the hollow chamber and configured to introduce an inert gas into the hollow chamber;

an inert gas discharge pipe communicated with the hollow chamber and configured to discharge the inert gas;

a pressure adjustment valve disposed on the inert gas discharge pipe; and a controller including a central processing unit (CPU) and a memory, the controller controls the pressure adjustment valve, wherein the memory stores a program that, when executed by the CPU:

defines a pressure of the lid member as a value obtained by dividing a mass of the lid member by an area of a portion of the lid member that is exposed to the hollow chamber, defines the pressure of a minimum closing portion as a pressure of a portion of the lid member at which the pressure of the lid member is minimum, and instructs the CPU to adjust an opening and closing degree of the pressure adjustment valve such that a pressure in the hollow chamber is (a) higher than a pressure in the reaction chamber by at least 0.6 $gf/cm^2$ and (b) less than or equal to the pressure of the minimum closing portion based on the lid member.

2. The semiconductor wafer manufacturing apparatus according to claim 1, wherein the susceptor includes an outer peripheral susceptor portion and an inner peripheral susceptor portion, the outer peripheral susceptor portion is supported by the one end portion of the cylindrical member and has a through hole, the inner peripheral susceptor portion has a portion disposed in the through hole, is supported by the outer peripheral susceptor portion, and is separable from the outer peripheral susceptor portion, the lid member is comprised of the susceptor, and the program defines the pressure of the minimum closing portion as a value obtained by dividing a mass of the inner peripheral susceptor portion by an area of a portion of the inner peripheral susceptor portion that is exposed to the hollow chamber.

3. The semiconductor wafer manufacturing apparatus according to claim 1, wherein the susceptor is formed of a single member disposed at an opening end portion of the cylindrical member, and the program defines the pressure of the minimum closing portion as a value obtained by dividing a mass of the susceptor by an area of a portion of the susceptor that is exposed to the hollow chamber.

4. The semiconductor wafer manufacturing apparatus according to claim 1, wherein the susceptor has a through hole, the base wafer is to be placed in a state of closing the through hole, the lid member is comprised of the susceptor and the base wafer, and the program defines the pressure of the minimum closing portion as a value obtained by dividing a mass of the base wafer by an area of a portion of the base wafer that is exposed to the hollow chamber.

5. The semiconductor wafer manufacturing apparatus according to claim 1, wherein an opening end portion of the inert gas supply pipe through which the inert gas is introduced is located closer to a center of the hollow chamber than an opening end portion of the inert gas discharge pipe through which the inert gas is suctioned.

6. The semiconductor wafer manufacturing apparatus according to claim 1, wherein an opening end portion of the inert gas supply pipe through which the inert gas is introduced is bent in a direction opposite to an opening end portion of the inert gas discharge pipe through which the inert gas is suctioned.

7. The semiconductor wafer manufacturing apparatus according to claim 1, further comprising:

a differential pressure gauge disposed at a connection portion between the reactant gas discharge pipe and the inert gas discharge pipe, wherein the pressure of the minimum closing portion is predetermined, the program, when executed by the CPU, instructs the CPU to adjust the opening and closing degree of the pressure adjustment valve while the rotating device rotates the susceptor and the base wafer such that the pressure in the hollow chamber is (a) higher than the pressure in the reaction chamber by at least 0.6 gf/cm$^2$, as sensed by the differential pressure gauge and (b) less than or equal to the predetermined pressure of the minimum closing portion based on the lid member, as sensed in the reactant gas discharge pipe.

8. The semiconductor wafer manufacturing apparatus according to claim 1, further comprising a pressure sensor disposed in the reactant gas discharge pipe and configured to sense the pressure in the reaction chamber.

9. A semiconductor wafer manufacturing apparatus comprising:

a reaction chamber forming member that forms a reaction chamber into which a reactant gas is to be introduced and in which an epitaxial layer is to be grown on a front surface of a base wafer;

a reactant gas supply pipe communicated with the reaction chamber and configured to supply the reactant gas for growing the epitaxial layer to the reaction chamber;

a reactant gas discharge pipe communicated with the reaction chamber and configured to discharge an unreacted gas from the reaction chamber;

a susceptor disposed in the reaction chamber and on which the base wafer is to be placed;

a rotating device having a cylindrical member with one end portion on which the susceptor is disposed and configured to rotate the susceptor together with the base wafer;

a lid member including the susceptor and disposed on the one end portion of the cylindrical member;

a heating device disposed in a hollow chamber that is a space surrounded by the cylindrical member and the lid member and configured to heat the base wafer;

an inert gas supply pipe communicated with the hollow chamber and configured to introduce an inert gas into the hollow chamber;

an inert gas discharge pipe communicated with the hollow chamber and configured to discharge the inert gas;

a pressure adjustment valve disposed on the inert gas discharge pipe;

a differential pressure gauge disposed at a connection portion between the reactant gas discharge pipe and the inert gas discharge pipe; and a controller including a central processing unit (CPU) and a memory, the controller controls the pressure adjustment valve, wherein the memory stores a program that, when executed by the CPU:

defines a pressure of the lid member as a value obtained by dividing a mass of the lid member by an area of a portion of the lid member that is exposed to the hollow chamber, defines a predetermined pressure of a minimum closing portion as a pressure of a portion of the lid member at which the pressure of the lid member is minimum, and instructs the CPU to adjust an opening and closing degree of the pressure adjustment valve while the rotating device rotates the susceptor and the base wafer such that a pressure in the hollow chamber is (a) higher than a pressure in the reaction chamber, as sensed by the differential pressure gauge and (b) less than or equal to the predetermined pressure of the minimum closing portion based on the lid member, as sensed in the reactant gas discharge pipe.

10. The semiconductor wafer manufacturing apparatus according to claim 9, wherein the pressure of (a) is higher than the pressure in the reaction chamber by at least 0.6 gf/cm$^2$, as sensed by the differential pressure gauge.

11. The semiconductor wafer manufacturing apparatus according to claim 9, further comprising a pressure sensor disposed in the reactant gas discharge pipe and configured to sense the pressure in the reaction chamber.

12. The semiconductor wafer manufacturing apparatus according to claim 9, wherein the susceptor includes an outer peripheral susceptor portion and an inner peripheral susceptor portion, the outer peripheral susceptor portion is supported by the one end portion of the cylindrical member and has a through hole, the inner peripheral susceptor portion has a portion disposed in the through hole, is supported by the outer peripheral susceptor portion, and is separable from the outer peripheral susceptor portion, the lid member is comprised of the susceptor, and the program defines the pressure of the minimum closing portion as a value obtained by dividing a mass of the inner peripheral susceptor portion by an area of a portion of the inner peripheral susceptor portion that is exposed to the hollow chamber.

13. The semiconductor wafer manufacturing apparatus according to claim 9, wherein the susceptor is formed of a single member disposed at an opening end portion of the cylindrical member, and the program defines the pressure of the minimum closing portion as a value obtained by dividing a mass of the susceptor by an area of a portion of the susceptor that is exposed to the hollow chamber.

14. The semiconductor wafer manufacturing apparatus according to claim 9, wherein the susceptor has a through hole, the base wafer is to be placed in a state of closing the through hole, the lid member is comprised of the susceptor and the base wafer, and the program defines the pressure of the minimum closing portion as a value obtained by dividing a mass of the base wafer by an area of a portion of the base wafer that is exposed to the hollow chamber.

15. The semiconductor wafer manufacturing apparatus according to claim 9, wherein an opening end portion of the inert gas supply pipe through which the inert gas is introduced is located closer to a center of the hollow chamber than an opening end portion of the inert gas discharge pipe through which the inert gas is suctioned.

16. The semiconductor wafer manufacturing apparatus according to claim 9, wherein an opening end portion of the inert gas supply pipe through which the inert gas is introduced is bent in a direction opposite to an opening end portion of the inert gas discharge pipe through which the inert gas is suctioned.

\* \* \* \* \*